United States Patent
Xu

(10) Patent No.: US 9,478,637 B2
(45) Date of Patent: Oct. 25, 2016

(54) SCALING EOT BY ELIMINATING INTERFACIAL LAYERS FROM HIGH-K/METAL GATES OF MOS DEVICES

(75) Inventor: Jeffrey Junhao Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1338 days.

(21) Appl. No.: 12/789,681

(22) Filed: May 28, 2010

(65) Prior Publication Data

US 2011/0012210 A1 Jan. 20, 2011

Related U.S. Application Data

(60) Provisional application No. 61/225,787, filed on Jul. 15, 2009.

(51) Int. Cl.

| | |
|---|---|
| H01L 29/78 | (2006.01) |
| H01L 29/66 | (2006.01) |
| H01L 21/28 | (2006.01) |
| H01L 29/51 | (2006.01) |
| H01L 21/02 | (2006.01) |
| H01L 21/306 | (2006.01) |

(52) U.S. Cl.
CPC ..... *H01L 29/6659* (2013.01); *H01L 21/02315* (2013.01); *H01L 21/28194* (2013.01); *H01L 29/513* (2013.01); *H01L 29/517* (2013.01); *H01L 29/7833* (2013.01); *H01L 21/02052* (2013.01); *H01L 21/306* (2013.01); *H01L 29/665* (2013.01)

(58) Field of Classification Search
None
See application file for complete search history.

(56) References Cited

U.S. PATENT DOCUMENTS

| | | | | |
|---|---|---|---|---|
| 6,897,095 | B1* | 5/2005 | Adetutu et al. | 438/119 |
| 7,691,701 | B1* | 4/2010 | Belyansky et al. | 438/229 |
| 2002/0048878 | A1 | 4/2002 | Song | |
| 2010/0099272 | A1* | 4/2010 | Vaartstra | 438/778 |

FOREIGN PATENT DOCUMENTS

| | | |
|---|---|---|
| CN | 101167177 A | 4/2008 |
| CN | 101593764 A | 12/2009 |

OTHER PUBLICATIONS

Fischetti, M. V., et al., "Effective Electron Mobility in Si Inversion Layers in Metal—Oxide-Semiconductor Systems with a High-κ Insulator: The Role of Remote Phonon Scattering," Journal of Applied Physics, vol. 90, No. 9, Nov. 1, 2001, pp. 4587-4608.

* cited by examiner

*Primary Examiner* — Fernando L Toledo
*Assistant Examiner* — Valerie N Newton
(74) *Attorney, Agent, or Firm* — Slater Matsil, LLP

(57) ABSTRACT

An integrated circuit structure includes a semiconductor substrate, and a phonon-screening layer over the semiconductor substrate. Substantially no silicon oxide interfacial layer exists between the semiconductor substrate and the phonon-screening layer. A high-K dielectric layer is located over the phonon-screening layer. A metal gate layer is located over the high-K dielectric layer.

20 Claims, 4 Drawing Sheets

SCALING EOT BY ELIMINATING INTERFACIAL LAYERS FROM HIGH-K/METAL GATES OF MOS DEVICES

This application claims the benefit of U.S. Provisional Application No. 61/225,787 filed on Jul. 15, 2009, entitled "Scaling EOT by Eliminating Interfacial Layers from High-K/Metal Gates of MOS Devices," which application is hereby incorporated herein by reference.

TECHNICAL FIELD

This disclosure relates generally to integrated circuit devices and more particularly to the structure of metal-oxide-semiconductor (MOS) devices and the methods of forming the same.

BACKGROUND

Scaling integrated circuits is a continuous effort in the manufacturing of integrated circuits. Currently, small-scale integrated circuits, which may be manufactured using 15 nm technology, are being researched. For metal-oxide-semiconductor (MOS) devices, the scaling results in the potential for high performance.

When the MOS devices are manufactured using 15 nm technology, the effective oxide thickness (EOT) of gate dielectrics also need to be downscaled, for example, to about 0.5 nm. However, there exists a dilemma. In order to meet the 0.5 nm EOT target for 15 nm logic technology, a typical 0.5 nm to 1.0 nm $SiO_2$ interfacial layer, which was commonly used in the state-of-the-art high-K/metal gate (HKMG) technology, has to be eliminated. However, when a commonly used Hf-based high-K dielectric is in direct contact with the underlying silicon channel, the carrier mobility in the channel region of the resulting MOS device was typically degraded to about 50% of a universal Si mobility (at a high electrical field, for example, about 1 MV/cm).

FIGS. 1 and 2 illustrate the intermediate stages in the manufacturing of a conventional MOS device. Referring to FIG. 1, silicon oxide interfacial layer 12 with a thickness of about 1 nm is on silicon substrate 10. High-K dielectric layer 14, which comprises $HfO_2$, is deposited on interfacial layer 12 using atomic layer deposition (ALD). Next, a thin Hf layer 16 is formed on high-K dielectric layer 14 as an oxygen-scavenging agent to deprive oxygen from interfacial layer 12 (symbolized by arrows 15), resulting in the structure shown in FIG. 2. The thin Hf layer 16 is converted to $HfO_2$ layer, and becomes part of high-K dielectric layer 14, also referred to as $HfO_2$ layer 14. Since oxygen is removed from interfacial layer 12, interfacial layer 12 is either converted to silicon or intermix with $HfO_2$ to form $HfSiO_x$, which is equivalent to eliminating the silicon oxide interface layer 12. As a result, the EOT of the resulting gate dielectric is scaled down, for example, to 0.6 nm.

A drawback of the process shown in FIGS. 1 and 2 is that the carrier mobility in the channel region will be degraded to between about 90% and about 50% of the universal Si mobility. In addition, the breakdown voltage of the resulting gate dielectric is reduced. This is because the elimination of the silicon oxide interfacial layer will result in an increase in the coupling between the remote soft optical phonon modes of the high-K dielectric and the carriers in the channel region of the resulting MOS device, and hence, a lower carrier mobility. Therefore, there is a tradeoff between EOT scaling and mobility degradation.

SUMMARY

In accordance with one aspect of the present disclosure, an integrated circuit structure includes a semiconductor substrate, and a phonon-screening layer over the semiconductor substrate. Substantially no silicon oxide interfacial layer exists between the semiconductor substrate and the phonon-screening layer. A high-K dielectric layer is located over the phonon-screening layer. A metal gate layer is located over the high-K dielectric layer.

Other embodiments are also disclosed.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel gate structure of a metal-oxide-semiconductor (MOS) device and the method of forming the same are presented. The intermediate stages of manufacturing an embodiment of the present disclosure are illustrated. The variations and the operation of the embodiment are then discussed. Throughout the various views and illustrative embodiments of the present disclosure, like reference numbers are used to designate like elements.

Figure 1:
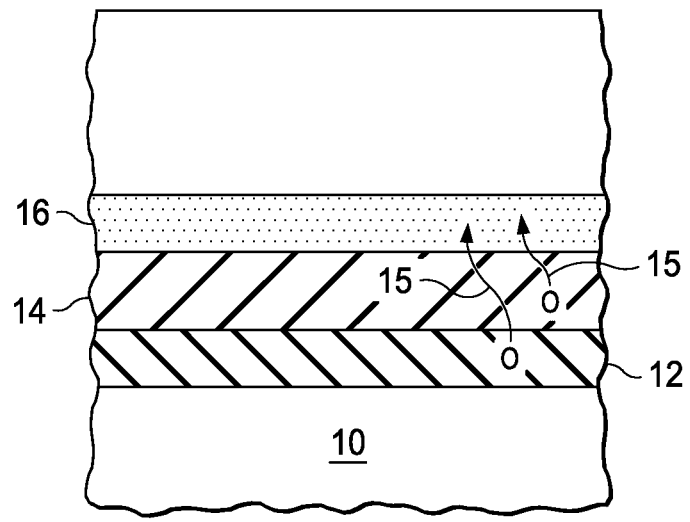
FIGS. 1 and 2 illustrate cross-sectional views of intermediate stages in the manufacturing of a conventional MOS device.
Figure 2:
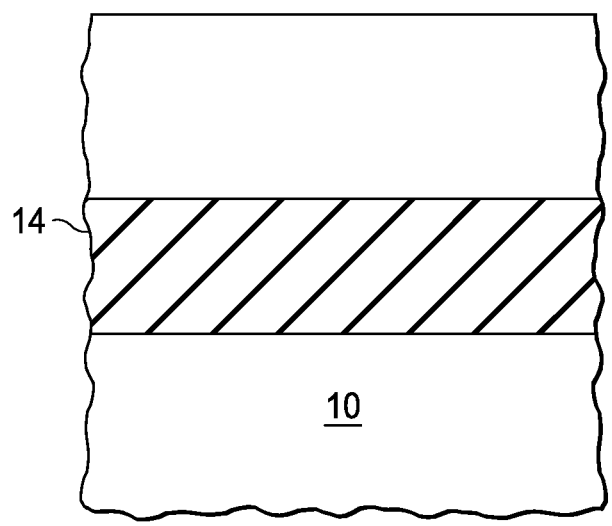
Figure 3A:
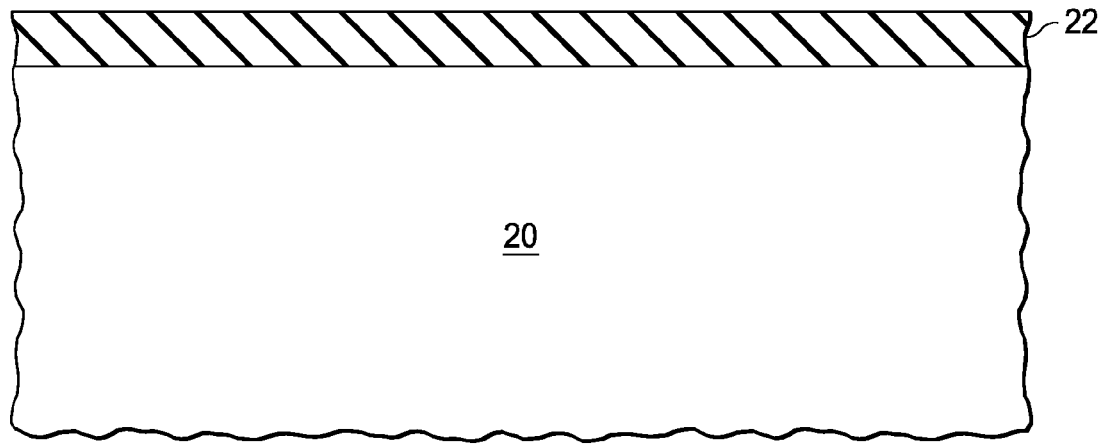
FIGS. 3A and 4-7 are cross-sectional views of intermediate stages in the manufacturing of an MOS device in accordance with an embodiment.

Referring to FIG. 3A, substrate 20 is provided, which may be formed of commonly used semiconductor materials such as silicon, silicon germanium (SiGe), silicon carbon (SiC), and the like. Shallow trench isolation (STI) regions (not shown, refer to 42 in FIG. 7) may be formed in substrate 20. Native oxide 22, which may be silicon oxide ($SiO_2$) may exist on the top surface of substrate 20.

Figure 3B:
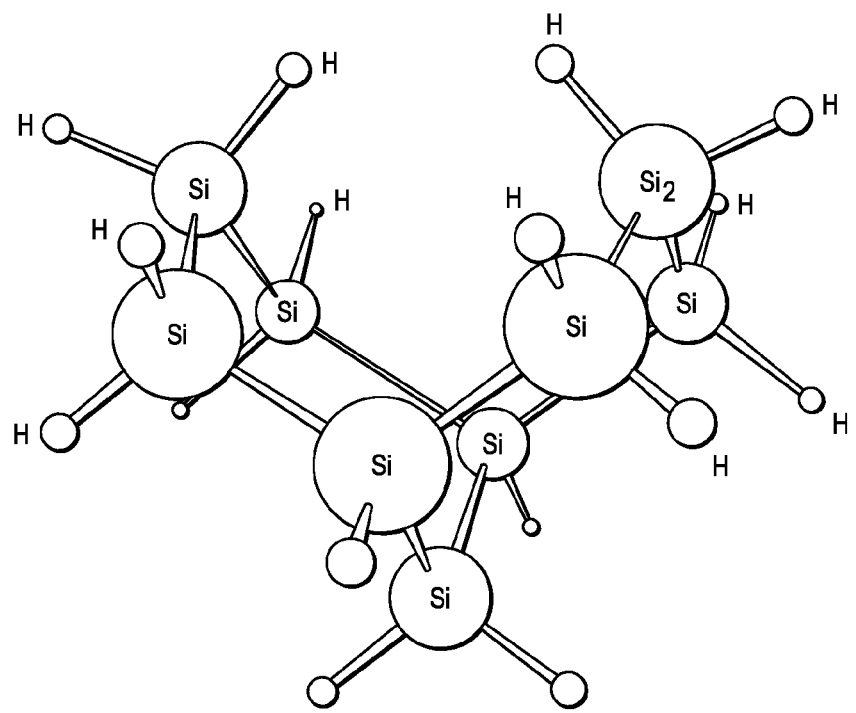
FIG. 3B illustrates the Si—H terminals at a surface of a semiconductor substrate.

A cleaning process is performed on the structure as shown in FIG. 3A. The cleaning process may include two steps. The first step, which is often referred to as standard clean 1 or SC1, includes an immersion of substrate 20 in a bath of $NH_4OH/H_2O_2/H_2O$ for, for example, about 10 minutes. This step is mainly aimed at removing particles and organic contamination. The second step, which is often referred to as standard clean 2 or SC2, uses a mixture of $HCl/H_2O_2/H_2O$ for, for example, about 10 minutes. This step is aimed at removing metallic contamination. Next, native oxide 22 can be removed, for example, using diluted hydrofluoric acid (DHF). As a result, Si-H terminals are formed on the surface of substrate 20, as schematically illustrated in FIG. 3B. In embodiments, the below described steps are performed before native oxide re-grows on the surface.

Figure 4:
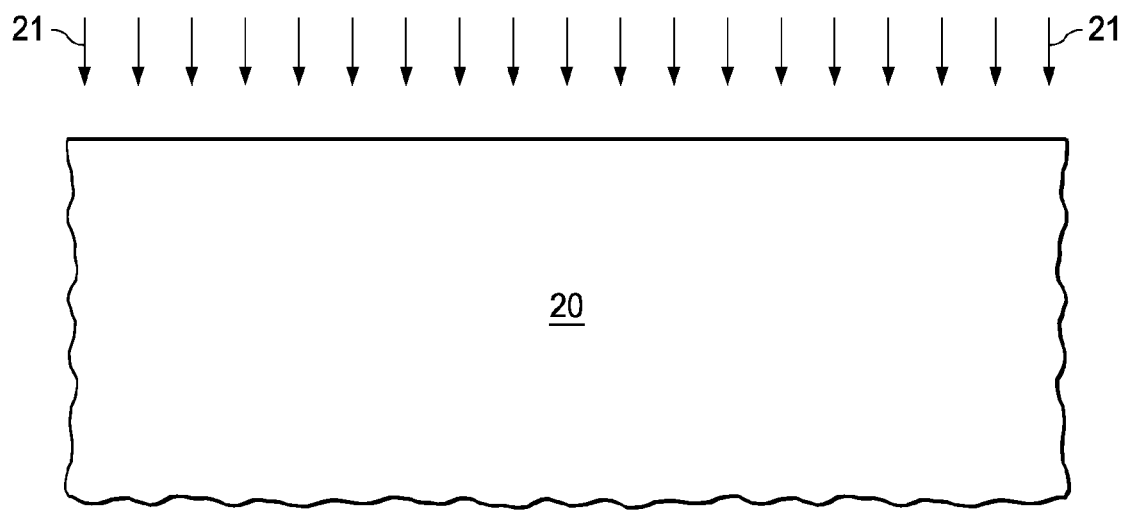

Referring to FIG. 4, an in-situ downstream plasma treatment is performed, as symbolized by arrows 21. The in-situ downstream plasma treatment may be performed using a nitrogen and hydrogen containing gas, such as $N_2/H_2$ or $N_2O/H_2$. Alternatively, other gases such as $NH_3$ and $NF_3$, and combinations thereof, may also be used. The downstream plasma treatment may result in the formation of an NH bonded surface of substrate 20, so that the subsequently performed atomic layer deposition (ALD) is improved.

In alternative embodiments, the in-situ downstream plasma treatment may be performed using downstream $H_2O$ plasma, with the $H_2O$ used as a process gas for generating the plasma. Accordingly, OH bonds are formed to terminate the surface of substrate 20. As a result, it is possible that a very thin layer of silicon oxide (which may be represented as $SiO_x$, with x being 1 or 2) interfacial layer 23 is formed on the surface of substrate 20. The thickness of silicon oxide interfacial layer 23 may be 2 Å, 1.5 Å, or even less, and it is possible that no silicon oxide interfacial layer 23 is formed at all. In an embodiment, the in-situ downstream $H_2O$ plasma may be performed for a duration between about 5 seconds and about 30 seconds, although different process conditions may also be used.

Figure 5:
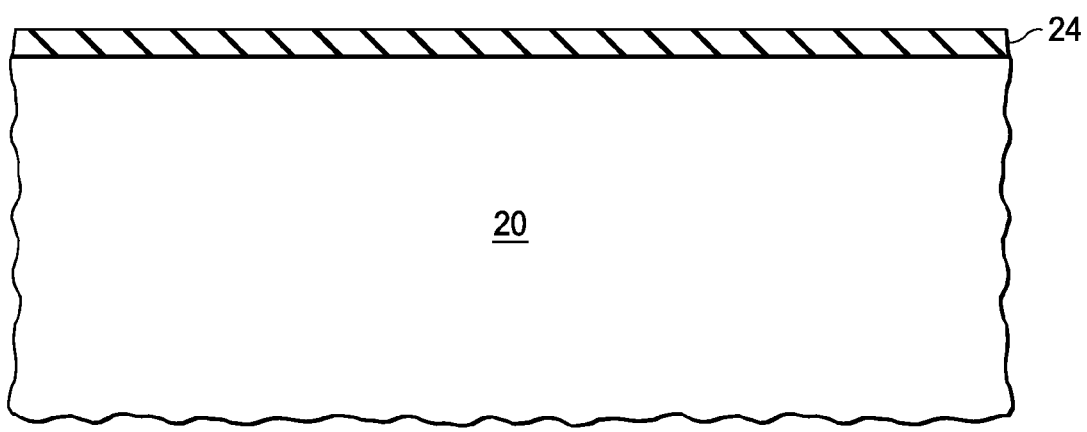

FIG. 5 illustrates the in-situ formation of phonon-screening layer 24, wherein substrate 20 is kept in a vacuum environment between the step of the downstream plasma treatment and the formation of phonon-screening layer 24. Further, with the in-situ formation of phonon-screening layer 24, no vacuum break occurs between the downstream plasma treatment step and the formation of phonon-screening layer 24. In an embodiment, phonon-screening layer 24 has two characteristics. First, it results in a weak coupling between the remote soft optical phonon modes of the overlying high-K dielectric layer 26 (not shown in FIG. 5, please refer to FIG. 6) and the carriers in channel region 40 (not shown in FIG. 5, please refer to FIG. 7). Second, it preserves carrier mobility in the channel region. Accordingly, the commonly known $HfO_2$ and $ZrO_2$ are not used in phonon-screening layer 24. The available materials of phonon-screening layer 24 include, but are not limited to, AlN, $ZrSiO_4$, and $Al_2O_3$. In the resulting structure, substantially no silicon oxide interfacial layer exists between substrate 20 and phonon-screening layer 24, which means either the interfacial layer does not exist at all, or has a thickness less than about 2 Å. Furthermore, the resulting MOS device as shown in FIG. 7 will experience several thermal steps during and after its formation. Accordingly, the elements in the very thin silicon oxide interfacial layer 23, if existing at all, may also be diffused into, and become a part of, phonon-screening layer 24, for example, $ZrSiO_4$. This will also cause silicon oxide interfacial layer 23 to be eliminated in subsequent process steps. However, the silicon oxide interfacial layers formed using conventional methods are relatively thick, and cannot be eliminated.

In an exemplary embodiment, phonon-screening layer 24 has a thickness less than about 0.8 nm, or even less than about 0.6 nm. It is realized, however, that the dimensions recited throughout the description are merely examples and may be changed if different formation technologies are used. In addition, the k value of phonon-screening layer 24 is greater than that of silicon oxide, and may even be greater than about 12. A high k value of phonon-screening layer 24 may advantageously result in a reduction in the EOT of the gate dielectric. Phonon-screening layer 24 may be formed by atomic layer deposition (ALD) or other applicable deposition methods.

Figure 6:
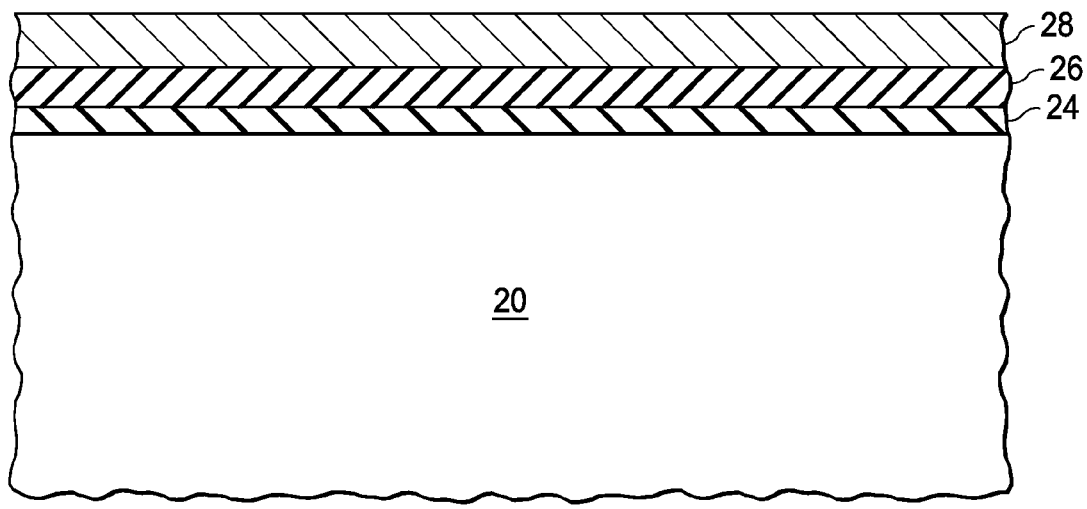
Figure 7:
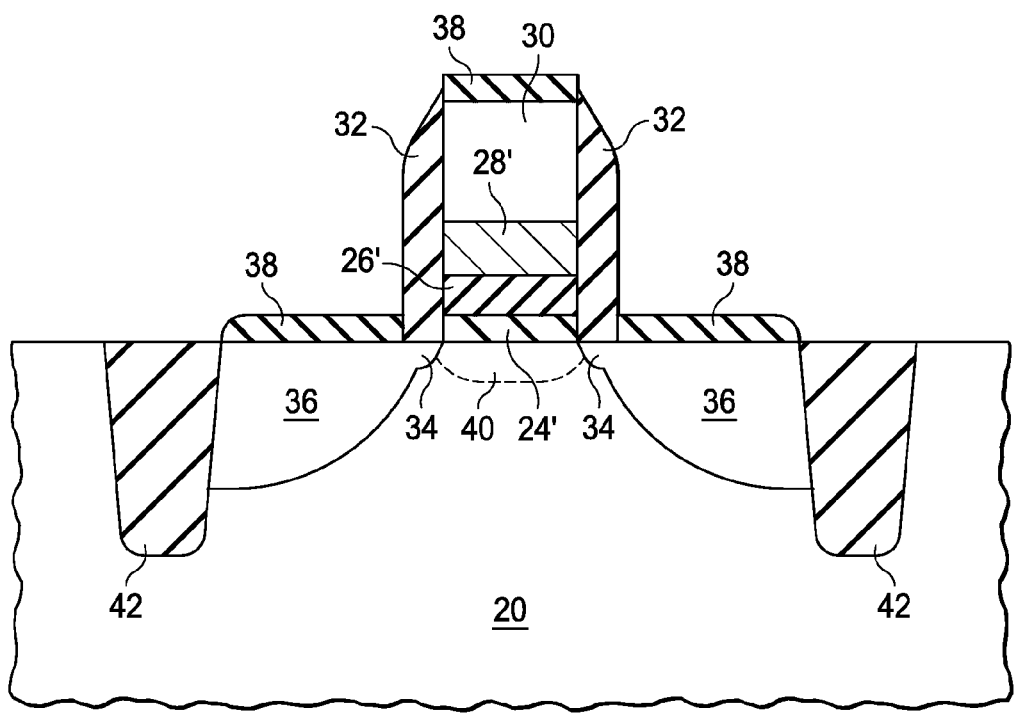

FIG. 6 illustrates the formation of high-K dielectric layer 26. In an exemplary embodiment, high-K dielectric layer 26 has a k value greater than the k value of phonon-screening layer 24. Further, the k value of high-K dielectric layer 26 may be greater than about 30, or even greater than about 40. The high k value of high-K dielectric layer 26 results in the reduction in the EOT of the gate dielectric of the resulting MOS device. The materials of high-K dielectric layer 26 may or may not have the phonon screening ability. Again, high-K dielectric layer 26 may be formed using ALD or other applicable deposition methods.

FIG. 6 also illustrates the formation of metal gate layer 28. The material of metal gate layer 28 depends on whether the resulting MOS device is an NMOS device or a PMOS device. If the resulting MOS device is an NMOS device, metal gate layer 28 may be formed of a band-edge metal having a low work function. Conversely, if the resulting MOS device is a PMOS device, metal gate layer 28 may be formed of a band-edge metal having a high work function.

The process may then be continued to form an MOS device, with the stacked layers shown in FIG. 6 patterned to form the gate stack of the resulting MOS device. FIG. 7 illustrates an exemplary MOS device. The resulting gate stack includes phonon-screening layer 24', high-K dielectric layer 26', and metal gate layer 28', which are the remaining portions of the patterned phonon-screening layer 24, high-K dielectric layer 26, metal gate layer 28, respectively, and polysilicon layer 30 (which in some embodiments is patterned simultaneously with other layers of the gate stack). Gate spacers 32, lightly-doped source/drain regions 34, deep source/drain regions 36, and silicides 38 are also formed. The formation processes of these components are known in the art, and hence are not repeated herein. In the resulting MOS device, substantially no interfacial layer (2 Å, 1.5 Å, or even less) exists between substrate 20 and phonon-screening layer 24, and it is possible that the interfacial layer is completely removed. Accordingly, phonon-screening layer 24 may contact substrate 20 directly.

In the embodiments, by removing the silicon oxide interfacial layer, the EOT of the gate dielectric is effectively reduced. In an exemplary embodiment in which the thickness of phonon-screening layer 24 (formed of $ZrSiO_4$) is about 0.8 nm, and the thickness of high-K dielectric layer 26 (formed of a high-K dielectric material with a k value greater than 30) is about 1.2 nm, the EOT of the gate dielectric is only 0.42 nm, which is less than the desirable target EOT of about 0.5 nm for 15 nm technology node. On the other hand, with the phonon-screening layer 24 for minimizing the coupling between the remote soft optical phonon modes of high-K dielectric layer 26 and the carriers in channel region 40 (FIG. 7) of the MOS device, the carrier mobility of the carriers in the channel region is not sacrificed. Accordingly, small-scale MOS devices with increased performance may be manufactured.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a semiconductor substrate;
a phonon-screening layer over the semiconductor substrate, wherein substantially no silicon oxide interfacial layer is between the semiconductor substrate and the phonon-screening layer;
a high-K dielectric layer over the phonon-screening layer; and
a metal gate layer over the high-K dielectric layer, wherein the phonon-screening layer, the high-K dielectric layer, and the metal gate layer are coterminous.

2. The integrated circuit structure of claim 1, wherein a thickness of any silicon oxide interfacial layer between the semiconductor substrate and the phonon-screening layer is less than about 2 Å.

3. The integrated circuit structure of claim 2, wherein no silicon oxide interfacial layer is between the semiconductor substrate and the phonon-screening layer.

4. The integrated circuit structure of claim 1, wherein the phonon-screening layer is in physical contact with the high-K dielectric layer.

5. The integrated circuit structure of claim 1, wherein the high-K dielectric layer has a k value greater than a k value of the phonon-screening layer.

6. The integrated circuit structure of claim 1, wherein the high-K dielectric layer has a k value greater than about 30.

7. The integrated circuit structure of claim 1, wherein the phonon-screening layer is formed of a material selected from a group consisting essentially of AlN, $ZrSiO_4$, and $Al_2O_3$.

8. The integrated circuit structure of claim 1, wherein the phonon-screening layer, the high-K dielectric layer, and the metal gate layer form a gate stack, and wherein the integrated circuit structure further comprises a source/drain region having a portion in the semiconductor substrate and adjacent the gate stack.

9. The integrated circuit structure of claim 1, wherein the phonon-screening layer and the high-K dielectric layer have a combined effective oxide thickness (EOT) less than about 0.5 nm.

10. An integrated circuit structure comprising:
a silicon substrate;
a gate stack comprising:
a phonon-screening layer over and contacting the silicon substrate, wherein substantially no silicon oxide interfacial layer is between the silicon substrate and the phonon-screening layer;
a high-K dielectric layer over the phonon-screening layer, wherein the high-K dielectric layer has a k value greater than a k value of the phonon-screening layer; and
a metal gate layer over the high-K dielectric layer;
a source/drain region adjacent the gate stack; and
an isolation region adjacent the source/drain region, wherein the phonon-screening layer is not over the isolation region.

11. The integrated circuit structure of claim 10, wherein the high-K dielectric layer has a k value greater than about 30.

12. The integrated circuit structure of claim 10, wherein the phonon-screening layer is formed of a material selected from a group consisting essentially of AlN, $ZrSiO_4$, and $Al_2O_3$.

13. The integrated circuit structure of claim 10, wherein the phonon-screening layer and the high-K dielectric layer have a combined effective oxide thickness (EOT) less than about 0.5 nm.

14. An integrated circuit structure comprising:
a silicon substrate;
a gate stack comprising:
a phonon-screening layer over and contacting the silicon substrate, wherein the phonon-screening layer is formed of a material selected from a group consisting essentially of AlN, $ZrSiO_4$, and $Al_2O_3$, and wherein substantially no silicon oxide interfacial layer is between the silicon substrate and the phonon-screening layer;
a high-K dielectric layer over the phonon-screening layer, wherein the high-K dielectric layer has a k value greater than a k value of the phonon-screening layer; and
a metal gate layer over the high-K dielectric layer; and
gate spacers on opposites sides of the gate stack, wherein the gate spacers are adjoining ends of the phonon-screening layer, the high-K dielectric layer, and the metal gate layer.

15. The integrated circuit structure of claim 14 further comprising a polysilicon layer over the metal gate layer.

16. The integrated circuit structure of claim 14 further comprising a source/drain region having a portion in the silicon substrate and adjacent the gate stack.

17. The integrated circuit structure of claim 14, wherein the phonon-screening layer and the high-K dielectric layer have a combined effective oxide thickness (EOT) less than about 0.5 nm.

18. The integrated circuit structure of claim 14, wherein the phonon-screening layer comprises AlN.

19. The integrated circuit structure of claim 14, wherein the phonon-screening layer comprises $ZrSiO_4$.

20. The integrated circuit structure of claim 14, wherein the phonon-screening layer comprises $Al_2O_3$.

* * * * *